(12) United States Patent
Kaufmann et al.

(10) Patent No.: US 9,983,057 B2
(45) Date of Patent: May 29, 2018

(54) OPTOELECTRONIC ARRANGEMENT

(71) Applicant: OSRAM Opto Semiconductors GmbH, Regensburg (DE)

(72) Inventors: Nils Kaufmann, Regensburg (DE); Alexander Martin, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days. days.

(21) Appl. No.: 15/568,913

(22) PCT Filed: Apr. 29, 2016

(86) PCT No.: PCT/EP2016/059595
§ 371 (c)(1),
(2) Date: Oct. 24, 2017

(87) PCT Pub. No.: WO2016/174194
PCT Pub. Date: Nov. 3, 2016

(65) Prior Publication Data
US 2018/0120157 A1    May 3, 2018

(30) Foreign Application Priority Data
Apr. 29, 2015   (DE) ......................... 10 2015 106 635

(51) Int. Cl.
*G01J 3/18* (2006.01)
*G01J 3/10* (2006.01)
(Continued)

(52) U.S. Cl.
CPC ............... *G01J 3/108* (2013.01); *G01J 3/18* (2013.01); *G01J 3/42* (2013.01); *H01L 33/505* (2013.01); *H01L 33/58* (2013.01)

(58) Field of Classification Search
CPC ..... G01J 3/108; G01J 3/18; G01J 3/42; H01L 33/505; H01L 33/58
See application file for complete search history.

(56) References Cited

U.S. PATENT DOCUMENTS 5,025,149 A      6/1991  Hatfield, Jr.
8,297,061 B2 *  10/2012  Brandes ............. C09K 11/7771
                                                     62/259.2
(Continued)

FOREIGN PATENT DOCUMENTS

DE    10 2012 215 702 A1    3/2014
EP         1 588 433 A2    10/2005
(Continued)

*Primary Examiner* — Marcus Taningco
(74) *Attorney, Agent, or Firm* — DLA Piper LLP (US)

(57) ABSTRACT

An optoelectronic arrangement includes an optoelectronic semiconductor chip, a wavelength-converting element and a detector component, wherein the optoelectronic arrangement is configured to emit light with a first peak wavelength and to emit light with a second peak wavelength, the first peak wavelength is in the visible spectral range and the second peak wavelength is in the non-visible spectral range or the first peak wavelength is in the non-visible spectral range and the second peak wavelength is in the visible spectral range, and the optoelectronic arrangement emits the light whose peak wavelength is in the non-visible spectral range into a target area, and the detector component is configured to detect light backscattered from the target area and the peak wavelength of which is in the non-visible spectral range.

10 Claims, 2 Drawing Sheets

(51) Int. Cl.
*G01J 3/42* (2006.01)
*H01L 33/58* (2010.01)
*H01L 33/50* (2010.01)

(56) References Cited

U.S. PATENT DOCUMENTS

| | | |
|---|---|---|
| 2002/0014838 A1* | 2/2002 | Verhoeckx ............ H01L 33/507 |
| | | 313/506 |
| 2005/0200831 A1 | 9/2005 | Staley et al. |
| 2007/0222981 A1 | 9/2007 | Ponsardin et al. |
| 2008/0265268 A1* | 10/2008 | Braune ................. H01L 33/507 |
| | | 257/98 |
| 2011/0084609 A1 | 4/2011 | Kawaguchi et al. |
| 2012/0056093 A1 | 3/2012 | Poteet et al. |
| 2012/0092665 A1 | 4/2012 | Vahey et al. |
| 2013/0168720 A1* | 7/2013 | Biebersdorf ............ H01L 33/50 |
| | | 257/98 |
| 2013/0229646 A1 | 9/2013 | Sakurai |
| 2014/0160253 A1 | 6/2014 | Backman et al. |

FOREIGN PATENT DOCUMENTS

| | | |
|---|---|---|
| EP | 1 588 433 B1 | 10/2005 |
| EP | 2 595 206 A1 | 5/2013 |
| JP | 2008-232919 A | 10/2008 |

* cited by examiner

OPTOELECTRONIC ARRANGEMENT

TECHNICAL FIELD

This disclosure relates to an optoelectronic arrangement.

BACKGROUND

Sensor arrangements configured to emit non-visible light and detect portions of the light backscattered by objects to be investigated to obtain information relating to these objects are known. The use of non-visible light makes it difficult in this case to align the emitted light with the objects to be investigated.

SUMMARY

We provide an optoelectronic arrangement including an optoelectronic semiconductor chip, a wavelength-converting element and a detector component, wherein the optoelectronic semiconductor chip is configured to emit light with a first peak wavelength, the wavelength-converting element is configured to convert light emitted by the optoelectronic semiconductor chip into light with a second peak wavelength, the optoelectronic arrangement is configured to emit light with the first peak wavelength and to emit light with the second peak wavelength, the first peak wavelength is in the visible spectral range and the second peak wavelength is in the non-visible spectral range or the first peak wavelength is in the non-visible spectral range and the second peak wavelength is in the visible spectral range, the optoelectronic arrangement emits the light whose peak wavelength is in the non-visible spectral range into a target area, and the detector component is configured to detect light backscattered from the target area and the peak wavelength of which is in the non-visible spectral range.

LIST OF REFERENCE SYMBOLS

Figure 1:
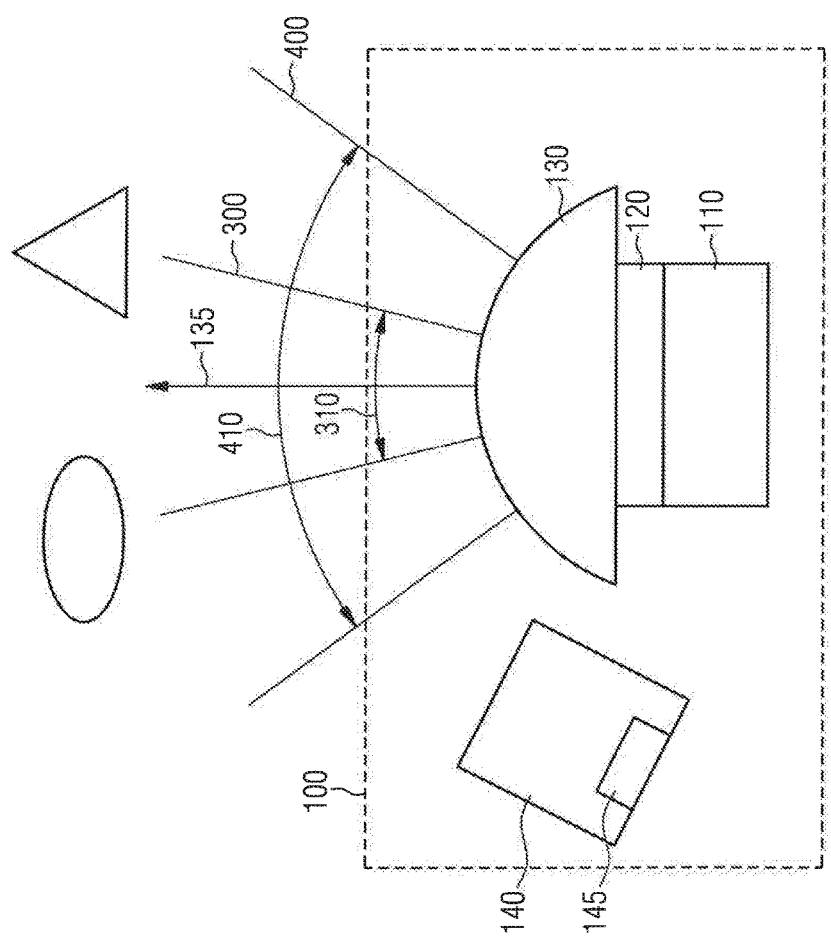
FIG. 1 shows a schematic illustration of a block diagram of an optoelectronic arrangement.

100 Optoelectronic arrangement
110 Optoelectronic semiconductor chip
120 Wavelength-converting element
130 Optical element
135 Spatial direction
140 Detector component
145 Silicon detector
200 Spectral diagram
201 Wavelength
202 Intensity
210 Equality wavelength
220 Equality intensity
300 First light
310 First solid angle
320 First spectral distribution
330 First peak wavelength
340 First maximum intensity
400 Second light
410 Second solid angle
420 Second spectral distribution
430 Second peak wavelength
440 Second maximum intensity

DETAILED DESCRIPTION

We provide an optoelectronic arrangement comprising an optoelectronic semiconductor chip, a wavelength-converting element and a detector component. The optoelectronic semiconductor chip is configured to emit light with a first peak wavelength. The wavelength-converting element is configured to convert light emitted by the optoelectronic semiconductor chip into light with a second peak wavelength. The optoelectronic arrangement is configured to emit light with the first peak wavelength and emit light with the second peak wavelength. Either the first peak wavelength is in the visible spectral range and the second peak wavelength is in the non-visible spectral range or the first peak wavelength is in the non-visible spectral range and the second peak wavelength is in the visible spectral range. The optoelectronic arrangement is provided to emit the light whose peak wavelength is in the non-visible spectral range into a target area. The detector component is configured to detect light backscattered from the target area and the peak wavelength of which is in the non-visible spectral range.

In this optoelectronic arrangement, the emitted light with a peak wavelength from the visible spectral range can be used to align the light emitted by the optoelectronic arrangement with a target area. As a result, the optoelectronic arrangement can be easily handled.

In this case, the light with a peak wavelength from the visible spectral range and the light with a peak wavelength from the non-visible spectral range are advantageously produced in this optoelectronic arrangement using only one optoelectronic semiconductor chip, as a result of which the optoelectronic arrangement can have a compact design and can be suitable for mobile use, for example. The optoelectronic arrangement may advantageously have a high degree of system efficiency as a result of the visible and non-visible light being produced using only one optoelectronic semiconductor chip. In addition, the use of only one optoelectronic semiconductor chip advantageously enables cost-effective production of the optoelectronic arrangement.

The first peak wavelength may be in the visible spectral range, while the second peak wavelength may be in the non-visible spectral range. In this case, the detector component is configured to detect light with the second peak wavelength. In this example, the optoelectronic semiconductor chip of the optoelectronic arrangement is therefore configured to produce light with a wavelength from the visible spectral range, for example, blue, green or red light.

The first peak wavelength may be in the non-visible spectral range, while the second peak wavelength may be in the visible spectral range. In this case, the detector component is configured to detect light with the first peak wavelength. In this example, the wavelength-converting element of the optoelectronic arrangement is therefore configured to convert light emitted by the optoelectronic semiconductor chip and has a peak wavelength from the non-visible spectral range into visible light, for example, into blue, green or red light.

The non-visible spectral range may be the infrared spectral range or the ultraviolet spectral range. As a result, the light emitted by the optoelectronic arrangement from the non-visible spectral range is advantageously suitable for investigating different properties of objects to be investigated, for example, investigating different material properties.

The light emitted by the optoelectronic semiconductor chip may have, at a wavelength at which the light that can be emitted by the optoelectronic semiconductor chip and the light that can be produced by the wavelength-converting element have the same intensity, at most 10% of the intensity at the first peak wavelength. The spectral distributions of the light emitted by the optoelectronic semiconductor chip and of the light produced by the wavelength-converting element are advantageously distinctly separated from one another as a result. This may make it possible to avoid parasitic effects.

The optoelectronic arrangement may be configured to emit light with the first peak wavelength and light with the second peak wavelength in the same spatial direction. As a result, the light emitted by the optoelectronic arrangement and has a peak wavelength from the visible spectral range advantageously makes it possible to align the light emitted by the optoelectronic arrangement and has a peak wavelength from the non-visible spectral range with objects to be investigated or a target area to be investigated in a particularly simple and accurate manner.

The optoelectronic arrangement may be configured to emit light with the first peak wavelength and light with the second peak wavelength into different solid angles. In this case, the light with a peak wavelength from the visible spectral range can be emitted into a smaller or larger solid angle than the light with a peak wavelength from the non-visible spectral range. Depending on the application, this advantageously makes it possible to align the light emitted by the optoelectronic arrangement with a target area to be investigated or target objects to be investigated in a particularly simple and/or particularly precise manner.

The optoelectronic arrangement may have an optical element having different refractive indices at the first peak wavelength and at the second peak wavelength. In this case, the optical element may be, for example, an optical lens, in particular an optical converging lens, for example. As a result of the different refractive indices of the optical element at the first peak wavelength and at the second peak wavelength, light from the visible spectral range and light from the non-visible spectral range are refracted differently by the optical element, as a result of which the two portions of the light can be focused differently by the optical element, for example.

The detector component may comprise a silicon detector. As a result, the detector component may be suitable, for example, for detecting light with a wavelength from the infrared spectral range. As a result, the detector component can be advantageously compact and cost-effective.

The optoelectronic arrangement may be an infrared spectrometer or a UV spectrometer. As a result, the optoelectronic arrangement can be used, for example, to investigate material properties of objects to be investigated.

The above-described properties, features and advantages and the manner in which they are achieved become clearer and more distinctly comprehensible in connection with the following description of the examples which are explained in more detail in connection with the drawings.

FIG. 1 shows a highly schematic block diagram of an optoelectronic arrangement 100. The optoelectronic arrangement 100 is used to sense an investigation area or objects arranged in an investigation area. The optoelectronic arrangement 100 may be, for example, in the form of a spectrometer, in particular an infrared spectrometer, for example. The optoelectronic arrangement 100 may be in the form of a portable device and may be provided for mobile use.

The optoelectronic arrangement 100 comprises an optoelectronic semiconductor chip 110. The optoelectronic semiconductor chip 110 is configured to emit light, that is to say electromagnetic radiation. The optoelectronic semiconductor chip 110 may be, for example, in the form of a light-emitting diode chip (LED chip) or a laser chip.

Figure 2:
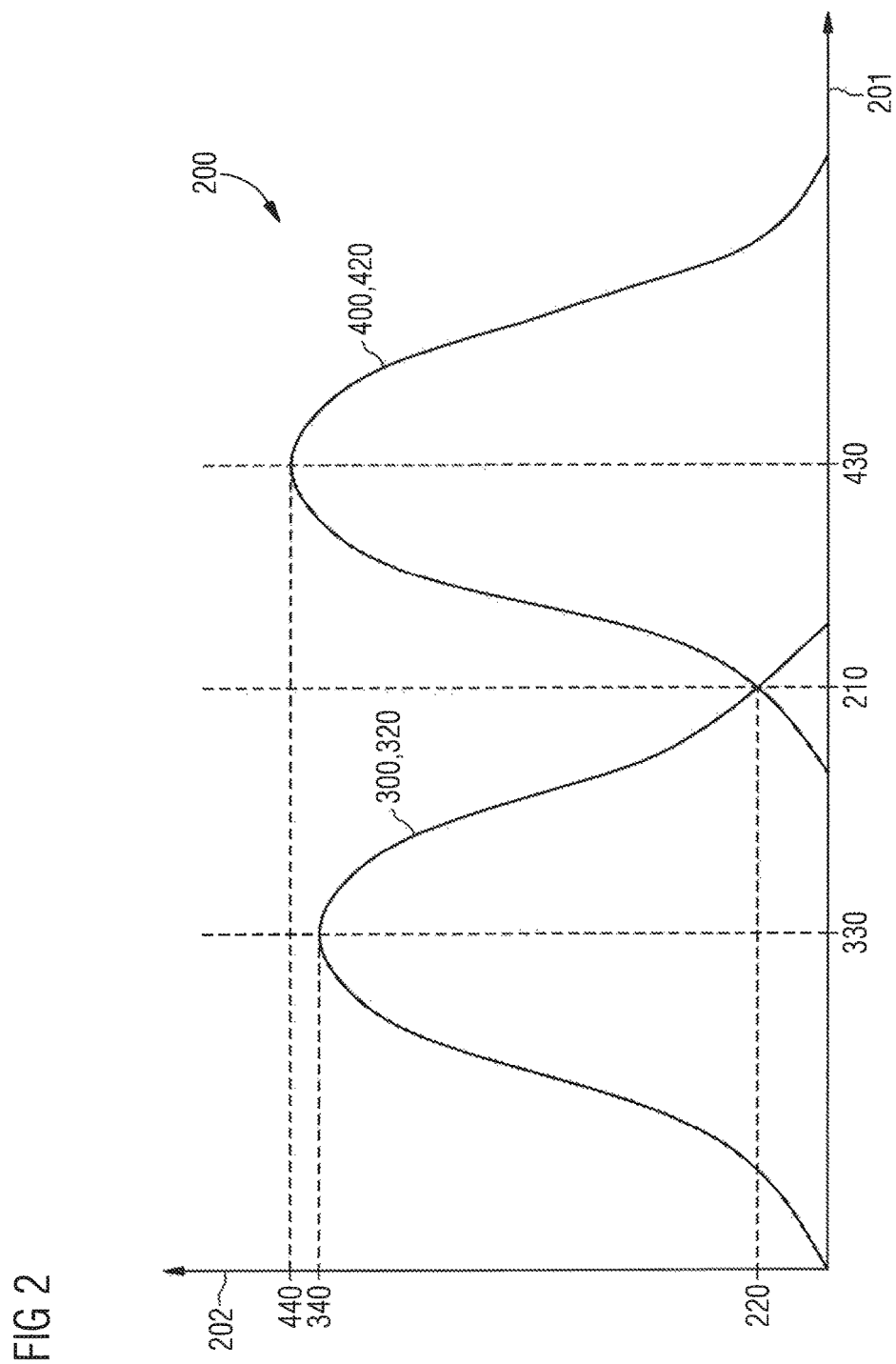
FIG. 2 shows a spectral diagram of light emitted by the optoelectronic arrangement.

FIG. 2 shows a schematic spectral diagram 200. A wavelength 201 is plotted on a horizontal axis of the spectral diagram 200. An intensity 202 is plotted on a vertical axis of the spectral diagram 200.

The optoelectronic semiconductor chip 110 is configured to emit first light 300 having a first spectral distribution 320 illustrated in FIG. 2 and has a first peak wavelength 330. The first light 300 has a first maximum intensity 340 at the first peak wavelength 330.

The optoelectronic arrangement 100 shown in FIG. 1 also comprises a wavelength-converting element 120. The wavelength-converting element 120 is configured to convert a part of the first light 300 emitted by the optoelectronic semiconductor chip 110 into second light 400. As illustrated in FIG. 2, the second light 400 has a second spectral distribution 420 that differs from the first spectral distribution 320 and has a second peak wavelength 430 that differs from the first peak wavelength 330. The second light 400 has a second maximum intensity 440 at the second peak wavelength 430.

The wavelength-converting element 120 may be directly arranged on the optoelectronic semiconductor chip 110 or may be spaced apart from the optoelectronic semiconductor chip 110. The wavelength-converting element 120 may be in the form of a coating or a small plate, for example. The wavelength-converting element 120 may have a matrix material and wavelength-converting particles embedded in the matrix material, for example. In this case, the wavelength-converting particles of the wavelength-converting element 120 are configured to convert a part of the first light 300 emitted by the optoelectronic semiconductor chip 110 into the second light 400.

In the example shown in FIG. 2, the second peak wavelength 430 of the second light 400 is greater than the first peak wavelength 330 of the first light 300. However, it is also possible for the second peak wavelength 430 of the second light 400 to be less than the first peak wavelength 330 of the first light 300. In this case, the wavelength-converting element 120 may be configured, for example, to absorb two or more light quanta of the first light 300 to produce one light quantum of the second light 400.

The first spectral distribution 320 of the first light 300 emitted by the optoelectronic semiconductor chip 110 is more narrowband than the second spectral distribution 420 of the second light 400 in many cases.

Either the first peak wavelength 330 of the first light 300 or the second peak wavelength 430 of the second light 400 is in the visible spectral range. In contrast, the other peak wavelength 430, 330 of the other light 400, 300 is in a non-visible spectral range, that is to say in a spectral range other than the visible spectral range mentioned above. Therefore, either the first peak wavelength 330 is in the visible spectral range and the second peak wavelength 430 is in a non-visible spectral range or the first peak wavelength 330 is in a non-visible spectral range and the second peak wavelength 430 is in the visible spectral range. The peak wavelength 330, 430 in the visible spectral range may be in the blue, green, red or hyper red spectral range, for example. The peak wavelength 330, 430 in a non-visible spectral range may be in the infrared or ultraviolet spectral range, for example.

The optoelectronic arrangement 100 is configured to emit both that part of the first light 300 emitted by the optoelectronic semiconductor chip 110 not converted by the wavelength-converting element 120 and the second light 400 produced by the wavelength-converting element 120 to the outside. It is expedient for the first light 300 and the second light 400 to be emitted in a common spatial direction 135. In this case, the first light 300 is emitted into a first solid angle 310. The second light 400 is emitted into a second solid angle 410. The first solid angle 310 and the second solid angle 410 may have different magnitudes. For example, the second solid angle 410 may be greater than the first solid angle 310, as schematically illustrated in FIG. 1. However, the first solid angle 310 may also be greater than the second solid angle 410.

The optoelectronic arrangement 100 may comprise an optical element 130 configured to shape the spatial distribution of the first light 300 emitted by the optoelectronic arrangement 100 and/or the spatial distribution of the second light 400 emitted by the optoelectronic arrangement 100. The optical element 130 may comprise, for example, an optical lens, in particular a converging lens, for example. The optical element 130 may differently image, for example, differently refract, the first light 300 with the first peak wavelength 330 and the second light 400 with the second peak wavelength 430. For this purpose, the optical element 130 may have, for example, different refractive indices at the first peak wavelength 330 and at the second peak wavelength 430. It is possible to dispense with the optical element 130.

The optoelectronic arrangement 100 also comprises a detector component 140. The detector component 140 is provided to detect the light 300, 400 emitted by the optoelectronic arrangement 100 and the peak wavelength 330, 430 of which is in a non-visible spectral range. If the first peak wavelength 330 of the first light 330 emitted by the optoelectronic semiconductor chip 110 is in a non-visible spectral range, the detector component 140 is therefore configured to detect the first light 300 with the first peak wavelength 330. Otherwise, the detector component 140 is configured to detect the second light 400 produced by the wavelength-converting element 120 of the optoelectronic arrangement 100 and the second peak wavelength 430 of which is in a non-visible spectral range.

It is expedient for the detector component 140 of the optoelectronic arrangement to be as insensitive as possible to the light 300, 400 emitted by the optoelectronic arrangement 100 and the peak wavelength 330, 430 of which is in the visible spectral range. This can be supported by the first spectral distribution 320 of the first light 300 and the second spectral distribution 420 of the second light 400 being separated from one another as completely as possible. Sufficient separation of the spectral distributions 320, 420 can be achieved, for example, when the first light 300 emitted by the optoelectronic semiconductor chip 110 of the optoelectronic arrangement 100 has at most 10% of the first maximum intensity 340 at an equality wavelength 210 at which the first light 300 emitted by the optoelectronic semiconductor chip 110 and the second light 400 produced by the wavelength-converting element 120 each have a matching equality intensity 220. The first light 300 and the second light 400 then have the same intensity at the equality wavelength 210, namely the equality intensity 220. The equality intensity 220 is at most 10% of the first maximum intensity 340 in this case.

The detector component 140 of the optoelectronic arrangement 100 may comprise a silicon detector 145, for example. In this case, the peak wavelength 330, 430 of the light 300, 400 emitted by the optoelectronic arrangement 100 and the peak wavelength 330, 430 of which is in a non-visible spectral range may be in the infrared spectral range, for example.

The light 300, 400 emitted by the optoelectronic arrangement 100 and the peak wavelength 330, 430 of which is in a non-visible spectral range is provided to detect or investigate a target area or objects arranged in the target area. For this purpose, the light 300, 400 emitted by the optoelectronic arrangement 100 in the spatial direction 135 and the peak wavelength 330, 430 of which is in a non-visible spectral range must be directed to the target area or the target objects arranged in the target area.

Light 300, 400 backscattered by the target area or the target objects arranged in the target area is captured by the detector component 140 of the optoelectronic arrangement 100 and can provide information relating to the target area or the target objects. The information may result, for example, from changes in the spectral distribution 320, 420 of the light 300, 400 whose peak wavelength 330, 430 is in a non-visible spectral range, for example, from changes in the spectral distribution 320, 420 caused by absorption.

The detector component 140 is arranged such that light 300, 400 backscattered from the target area strikes the detector component 140. It is expedient to arrange the detector component 140 such that no light or only little light 300, 400 emitted by the optoelectronic arrangement 100 strikes the detector component 140 directly, that is to say without backscatter from the target area. This can be achieved, for example, by providing suitable apertures between the optoelectronic semiconductor chip 110, the wavelength-converting element 120 and the optical element 130, on the one hand, and the detector component 140, on the other hand.

The light 300, 400 emitted by the optoelectronic arrangement 100 and the peak wavelength 330, 430 of which is in the visible spectral range makes it easier to align the light 300, 400 emitted by the optoelectronic arrangement 100 and the peak wavelength 330, 430 of which is in a non-visible spectral range with the target area or the target objects to be investigated. If both the first light 300 and the second light 400 are emitted in the same spatial direction 135, the light 300, 400 emitted by the optoelectronic arrangement 100 and the peak wavelength 330, 430 of which is in the visible spectral range must also be directed to the target area to be investigated or the target objects to be investigated for this purpose.

Our arrangements have been described and illustrated more specifically using the preferred examples. Nevertheless, this disclosure is not restricted to the disclosed examples. Rather, other variations can be derived therefrom by those skilled in the art without departing from the scope of protection of the appended claims.

This application claims priority of DE 10 2015 106 635.1, the subject matter of which is incorporated herein by reference.

The invention claimed is:

1. An optoelectronic arrangement comprising:
an optoelectronic semiconductor chip, a wavelength-converting element and a detector component, wherein
the optoelectronic semiconductor chip is configured to emit light with a first peak wavelength,
the wavelength-converting element is configured to convert light emitted by the optoelectronic semiconductor chip into light with a second peak wavelength, the optoelectronic arrangement is configured to emit light with the first peak wavelength and to emit light with the second peak wavelength, the first peak wavelength is in the visible spectral range and the second peak wavelength is in the non-visible spectral range or the first peak wavelength is in the non-visible spectral range and the second peak wavelength is in the visible spectral range, the optoelectronic arrangement emits the light whose peak wavelength is in the non-visible spectral range into a target area, and the detector component is configured to detect light backscattered from the target area and the peak wavelength of which is in the non-visible spectral range.

2. The optoelectronic arrangement according to claim 1, wherein the first peak wavelength is in the visible spectral range and the second peak wavelength is in the non-visible spectral range, and the detector component is configured to detect light with the second peak wavelength.

3. The optoelectronic arrangement according to claim 1, wherein the first peak wavelength is in the non-visible spectral range and the second peak wavelength is in the visible spectral range, and the detector component is configured to detect light with the first peak wavelength.

4. The optoelectronic arrangement according to claim 1, wherein the non-visible spectral range is the infrared spectral range or the ultraviolet spectral range.

5. The optoelectronic arrangement according to claim 1, wherein the light emitted by the optoelectronic semiconductor chip has, at a wavelength at which the light that can be emitted by the optoelectronic semiconductor chip and the light that can be produced by the wavelength-converting element have the same intensity, at most 10% of the intensity at the first peak wavelength.

6. The optoelectronic arrangement according to claim 1, configured to emit light with the first peak wavelength and light with the second peak wavelength in the same spatial direction.

7. The optoelectronic arrangement according to claim 1, configured to emit light with the first peak wavelength and light with the second peak wavelength into different solid angles.

8. The optoelectronic arrangement according to claim 1, further comprising an optical element having different refractive indices at the first peak wavelength and at the second peak wavelength.

9. The optoelectronic arrangement according to claim 1, wherein the detector component comprises a silicon detector.

10. The optoelectronic arrangement according to claim 1, which is an infrared spectrometer or a UV spectrometer.

* * * * *